(12) United States Patent
Ling

(10) Patent No.: US 8,994,050 B2
(45) Date of Patent: Mar. 31, 2015

(54) METHOD FOR TRANSFERRING A UNIFORM PHOSPHOR LAYER ON AN ARTICLE AND LIGHT-EMITTING STRUCTURE FABRICATED BY THE METHOD

(75) Inventor: Peiching Ling, San Jose, CA (US)

(73) Assignee: ARCHOLUX, Inc., San Jose, CA (US)

( * ) Notice: Subject to any disclaimer, the term of this patent is extended or adjusted under 35 U.S.C. 154(b) by 213 days.

(21) Appl. No.: 13/083,741

(22) Filed: Apr. 11, 2011

(65) Prior Publication Data

US 2011/0248305 A1     Oct. 13, 2011

Related U.S. Application Data

(60) Provisional application No. 61/322,866, filed on Apr. 11, 2010.

(51) Int. Cl.
*H01L 33/50* (2010.01)

(52) U.S. Cl.
CPC .............. *H01L 33/505* (2013.01); *H01L 33/507* (2013.01); *H01L 2933/0041* (2013.01)
USPC ...................................... 257/98; 257/E33.061

(58) Field of Classification Search
CPC ..... H01L 33/502; H01L 33/507; H01L 33/50; H01L 33/505; H01L 31/18; H01L 33/501
USPC ................... 257/98, E33.061; 438/26, 27, 29
See application file for complete search history.

(56) References Cited

U.S. PATENT DOCUMENTS

| | | | |
|---|---|---|---|
| 6,046,539 A | 4/2000 | Haven et al. | |
| 7,294,861 B2 | 11/2007 | Schardt et al. | |
| 7,479,662 B2 | 1/2009 | Soules et al. | |
| 2004/0007961 A1* | 1/2004 | Srivastava et al. | 313/486 |
| 2006/0038188 A1 | 2/2006 | Erchak et al. | |
| 2006/0105485 A1* | 5/2006 | Basin et al. | 438/27 |
| 2007/0096131 A1* | 5/2007 | Chandra | 257/99 |
| 2007/0228949 A1* | 10/2007 | Maruyama et al. | 313/512 |
| 2008/0079017 A1 | 4/2008 | Loh et al. | |
| 2008/0173884 A1 | 7/2008 | Chitnis et al. | |
| 2008/0176066 A1 | 7/2008 | Chang et al. | |
| 2008/0290351 A1 | 11/2008 | Ajiki et al. | |
| 2009/0065790 A1 | 3/2009 | Chitnis et al. | |
| 2009/0134414 A1 | 5/2009 | Li et al. | |
| 2009/0179207 A1* | 7/2009 | Chitnis et al. | 257/88 |
| 2009/0236619 A1* | 9/2009 | Chakroborty | 257/89 |
| 2009/0272996 A1 | 11/2009 | Chakraborty | |
| 2010/0090245 A1* | 4/2010 | Lin et al. | 257/100 |
| 2010/0291313 A1 | 11/2010 | Ling | |
| 2011/0039358 A1 | 2/2011 | Ling | |
| 2011/0045619 A1 | 2/2011 | Ling | |

OTHER PUBLICATIONS

International Search Report and Written Opinion for International Application No. PCT/US2011/032276 dated Oct. 16, 2012, 17 pages.

* cited by examiner

*Primary Examiner* — Wael Fahmy
*Assistant Examiner* — Sarah Salerno
(74) *Attorney, Agent, or Firm* — Amin, Turocy & Watson, LLP

(57) ABSTRACT

A method of transferring a uniform phosphor layer on an article and a light-emitting structure having a uniform phosphor layer. The method includes disposing a surface of the article in a proximity of a carrier having the uniform phosphor layer on a surface thereon, and causing the uniform phosphor layer to be secured to the surface of the article. Therefore, the uniform phosphor layer is secured to the articles according to a contour of the article.

19 Claims, 11 Drawing Sheets

METHOD FOR TRANSFERRING A UNIFORM PHOSPHOR LAYER ON AN ARTICLE AND LIGHT-EMITTING STRUCTURE FABRICATED BY THE METHOD

CROSS-REFERENCES TO RELATED APPLICATIONS

This application relates to Ser. No. 61/216,374 filed May 15, 2009, Ser. No. 61/273,129 filed Jul. 30, 2009, Ser. No. 61/284,792 filed Dec. 26, 2009, Ser. No. 12/587,290 filed Oct. 5, 2009, Ser. No. 12/587,281 filed Oct. 5, 2009 and Ser. No. 12/587,291 filed Oct. 5, 2009, which are incorporated herein by reference.

BACKGROUND OF THE INVENTION

1. Field of the Invention

This invention relates to methods for transferring a uniform phosphor layer on an article, and, more particularly, to a method of transferring a uniform phosphor layer that converts LED light wavelengths on an article and a light-emitting structure fabricated by the method.

2. Description of Related Art

Phosphor materials are widely applied to LED packages that include blue pump LEDs and green or red phosphors and emit white light (e.g., a mixture of blue light emitted from the blue pump LEDs with green or red light converted from the blue light by the phosphor materials). Conventional methods for depositing phosphor materials on blue LED chip or package assembly include:

Slurry method: phosphor powders are distributed in silicon, epoxy resin or solvent filling material, to form a phosphor mixture, and the phosphor mixture is applied to a surface of an LED or a package lens material by spraying coating or immersing coating techniques.

Electrophoretic deposition (EPD): phosphor powders are distributed in electrochemistry solution and deposited on an LED wafer through a bias voltage spanning across the LED wafer and the electrochemistry solution. The conventional methods encounter a problem that the surface of the LED or the interior of the LED package does not have a uniform thickness. The slurry method forms a layer of particles that does not have a uniform thickness. As a result, the LED does not have uniform light color points and the light converted by the phosphors has poor color uniformity. Moreover, the conventional methods are difficult to be applied to an uneven surface and to form a uniform layer of phosphors. It is a real challenge to use the conventional methods to satisfy lighting application demands.

In the conventional coating process, such as the slurry method that applies the phosphor mixture to an LED chip, wafer or package, the phosphor powders are mixed with silicon, and the mixture is applied to the LED chip, wafer or package by "glob" dispensing, spin-coating, injection, Electrophoretic deposition or molding methods. The subsequent wire-bonding process thus faces a great challenge, because it is hard to pattern the silicon material that is cured, which cannot applied with standard developer and photoresist. Therefore, the phosphor mixture are generally coated or deposited following the packaging stage such as the wire-bonding process.

It is also known that a remote phosphor technique, when applying phosphor silicon to an uneven package surface of an LED, faces a problem regarding the uniformity of phosphor coating, since the phosphor-silicon mixture has a viscosity greater than that of the cured LED encapsulant, and thus has a greater curvature, i.e., the layer of phosphors having a central region thicker than an outer region. In the application of the remote phosphor technique, forming a uniform phosphor coating layer on second-order optical elements of an LED also faces the same challenges.

The conventional methods still suffer the problems that the distribution capacity of phosphors cannot be controlled, the LED does not have consistent light color points, and the light converted from the phosphors has poor color uniformity. Therefore, how to provide a method for transferring a uniform phosphor layer on an article and a light-emitting structure thus fabricated is becoming one of the most popular issues in the art.

SUMMARY OF THE INVENTION

In view of the above-mentioned problems of the prior art, the present invention provides a method for transferring a uniform phosphor layer on an article, comprising the steps of: providing a carrier having the uniform phosphor layer formed on a surface thereof; disposing a surface of the article in a proximity of the uniform phosphor layer; and causing the uniform phosphor layer to be secured to the surface of the article.

In an embodiment of the present invention, the uniform phosphor layer is secured to the surface of the article by applying a vacuum to a space between the article and the carrier.

In order for the uniform phosphor layer to be detached from the carrier, the carrier may comprise a body and a release film disposed thereon, and the uniform phosphor layer is positioned on the release film. Further, the release film and the uniform phosphor layer are secured to the surface of the article together, and the method further comprises removing the release film.

Regarding the composition of the uniform phosphor layer, in an embodiment of the present invention the uniform phosphor layer comprises phosphor powders and a binder material, wherein the phosphor powders in the uniform phosphor layer occupy more than 75% in volume of the uniform phosphor layer.

In another embodiment of the present invention, the uniform phosphor layer comprises phosphor powders that are constituted by a plurality of phosphor particles, and none of the phosphor particles is completely separated from adjacent ones. The uniform phosphor layer according to the present invention may be attached and secured to the carrier by electrostatic charges, so as to obtain the uniform phosphor layer.

In an embodiment of the present invention, the carrier further comprises a binder layer formed on the uniform phosphor layer, and the uniform phosphor layer is secured on the surface of the article through the binder layer.

In an embodiment of the present invention, the article is an LED wafer, an LED die, an LED package or a lens.

In an embodiment of the present invention, the article further has at least one metal pad formed on the surface thereof in proximity of the uniform phosphor layer, or the article further has a pedestal formed on the at least metal pad, and the method further comprises patterning the uniform phosphor layer to expose the metal pad therefrom following the uniform phosphor layer being secured to the surface of the article.

In an embodiment, the present invention further provides a light-emitting structure having a uniform phosphor layer, comprising: an light-emitting article having at least one metal pad formed on a surface thereof; and a uniform phosphor layer that is secured on the surface of the light-emitting article, wherein the uniform phosphor layer has at least one opening corresponding to the metal pad that exposes the metal pad.

In another embodiment, the present invention further provides a light-emitting structure having a uniform phosphor layer, comprising: an LED package comprising a substrate having a recess, an LED die disposed in the bottom of the recess, and an encapsulant formed in the recess and covered the LED die; and a uniform phosphor layer that is secured to the surface of the encapsulant.

In the traditional method, the phosphor powders are generally distributed in the silicon or liquid, and then disposed on the surfaces of an LED or package, so the phosphor powders cannot be effectively distributed in the silicon or liquid uniformly. After the silicon or liquid in which the phosphor particles are distributed is coated on the LED element or package, the distribution uniformity of the phosphor powders cannot be controlled effectively. As a result, in the phosphor powders formed in the uniform phosphor layer by the conventional methods, some will congregate and connect to one another, while others exist independently. Therefore, the LED product has the problems of inconsistent light color points and that the color uniformity does not meet the demand. The present invention may overcome the conventional problems effectively. The method provided according to the present invention includes forming a uniform phosphor layer on a surface of a carrier; disposing a surface of the article in a proximity of the uniform phosphor layer; and causing the uniform phosphor layer to be attached and secured to the surface of the article. Through the attaching way, the uniform phosphor layer may be transferred to an article in any contour conveniently and smoothly. When the article is an LED, the distribution uniformity of the phosphor particles may be controller effectively, and the method has an advantage of uniform converted light color points.

BRIEF DESCRIPTION OF DRAWINGS

The invention can be more fully understood by reading the following detailed description of the preferred embodiments, with reference made to the accompanying drawings, wherein:

FIGS. 6A to 6C are schematic diagrams of a method for transferring a uniform phosphor layer on an article of a fifth embodiment according to the present invention, wherein FIG. 6C is a cross-sectional view of FIG. 6B along a line A-A;

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Phosphors convert or change light wavelengths, e.g., converting or changing a light source in an LED type. General phosphors include YAG material, TAG material, ZnSeS+material, SiAlON material (e.g., α-SiAlON), etc. However, according to embodiments of the present invention, any material that converts or changes the wavelength of incident light may be used as a phosphor material. The term "phosphor" herein indicates any material that may convert or change a light wavelength to another wavelength, and includes a mixture or compound having wavelength changing materials. In an embodiment, the phosphor is in the form of powders, and may be called as phosphor powders. The phosphor powders are constituted by a plurality of phosphor particles.

The First Embodiment

Figure 1A:
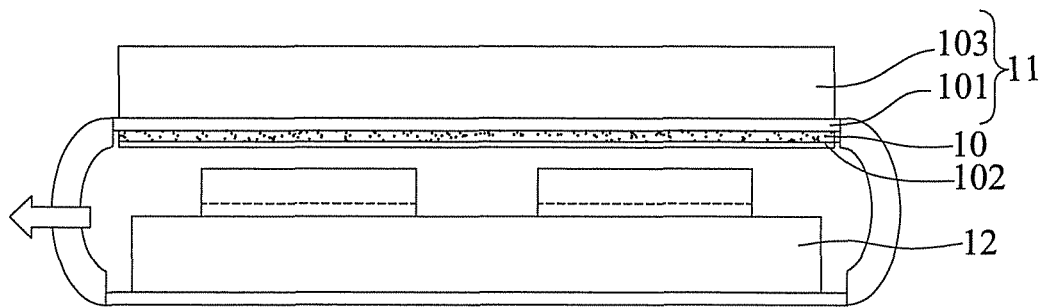
FIGS. 1A to 1C are schematic diagrams of a method for transferring a uniform phosphor layer on an article of a first embodiment according to the present invention.
Figure 1B:
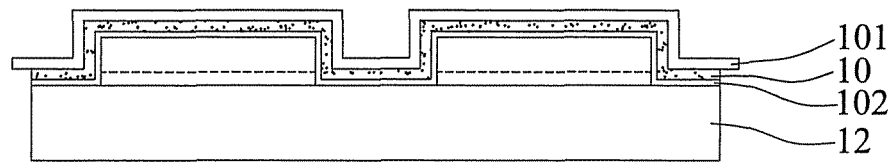
Figure 1C:
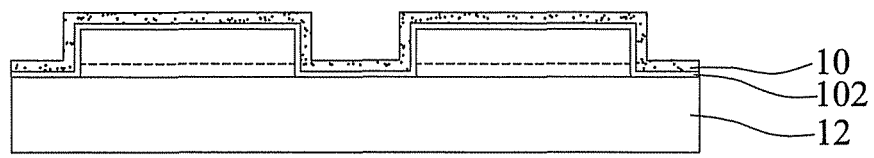

Please refer to FIGS. 1A to 1C, which are schematic diagrams of a method for transferring a uniform phosphor layer on an article of a first embodiment according to the present invention.

As shown in FIG. 1A, a carrier 11 is provided that has a uniform phosphor layer 10 on a surface thereof. In the first embodiment, the uniform phosphor layer 10 that is substantially uniform is deposited on the surface of the carrier 11 in an electrostatic charge process. The details of the electrostatic charge process may refer to Ser. No. 61/216,374 filed May 15, 2009, Ser. No. 61/273,129 filed Jul. 30, 2009, Ser. No. 61/284,792 filed Dec. 26, 2009, Ser. No. 12/587,290 filed Oct. 5, 2009, Ser. No. 12/587,281 filed Oct. 5, 2009 and Ser. No. 12/587,291 filed Oct. 5, 2009, which are incorporated herein for reference.

For instance, the uniform phosphor layer 10 is formed by forming electrostatic charges on the carrier 11 or grounding the carrier 11, and disposing the carrier 11 in a proximity of the uniform phosphor layer 10 to make the uniform phosphor layer 10, which has oppositely-charged phosphor powders or particles that are constituted by phosphor powder and a binder material, to be attached and secured to the surface of the carrier 11, so as to form the uniform phosphor layer 10. Of course, the phosphor powders may carry no charge, and the uniform phosphor layer 10 is formed by the carrier 11 that has charges. Different from the conventional electrochemistry charge process in a slurry environment, the electrostatic charge process is performed in a non-liquid environment. Accordingly, during the deposition process the phosphor powders and a binder material need not have uniform distribution in a liquid suspension, and will not suffer this problem. In a portion of the embodiments of the present invention, the phosphor powders and the binder material are formed and/or coated on a first surface of a mold. Therefore, the phosphor powders may have a coating density and layer thickness precisely controlled in the electrostatic charge process. In another embodiment of the present invention, a plurality of uniform phosphor layers may be formed by iterating the electrostatic charge process. The "particles that are constituted by phosphor powders and a binder material" are a mixture of phosphor powders and a binder material or the binder material capsulating the phosphor powders, and the phosphor powders occupy more than 75% in volume of the uniform phosphor layer.

In the embodiment shown in FIG. 1A, the carrier 11 comprises a body 103 and a release film 101 that is mechanically or vacuumedly secured on the body 103, and the uniform phosphor layer 10 is positioned on the release film 101. The body 103 may comprise semiconductor, metal, glass or transparent material. When the uniform phosphor layer 10 comprises phosphor powders that are constituted by a plurality of phosphor particles, none of the phosphor particles in the uniform phosphor layer 10 is completely separated from adjacent ones. A binder layer 102 (less than 10 μm in thickness) is further formed on the uniform phosphor layer 10 of the carrier 11 following the electrostatic charge process. The binder layer 102 may be silicon, epoxy resin, glass, softens or any suitable material for an LED package. For example, the binder layer 102 may include parylene that has excellent anti-moisture property, so as to prevent the phosphors or LEDs from being degraded during damp/hot operation conditions.

As shown in FIG. 1B, a surface of the article 12 is caused to be in a proximity of the uniform phosphor layer 10; and a vacuum is applied to a space between the article 12 and the carrier 11, making the uniform phosphor layer 10 to be attached and secured to the surface of the article 12 through the binder layer 102. In an embodiment, the release film 101 and the uniform phosphor layer 10 are attached and secured to the surface of the article 12 together, and the method further comprises removing the release film 101, as shown in FIG. 1C. Since the release film 101 is made of a soft material, the uniform phosphor layer 10 is still a conformal and uniform covered film after the release film 101 is removed.

On the other hand, each of the phosphor particles in the uniform phosphor layer 10 comprises phosphor powders and a binder material, and the phosphor powders in the uniform phosphor layer occupy more than 75% in volume of the uniform phosphor layer. According to the embodiment, the binder layer 102 may be omitted.

In addition to the vacuumedly secured method, the carrier 11 and the article 12 may be compressed, such that the uniform phosphor layer 10 may be secured on the surface of the article 12.

The Second Embodiment

Figure 2A:
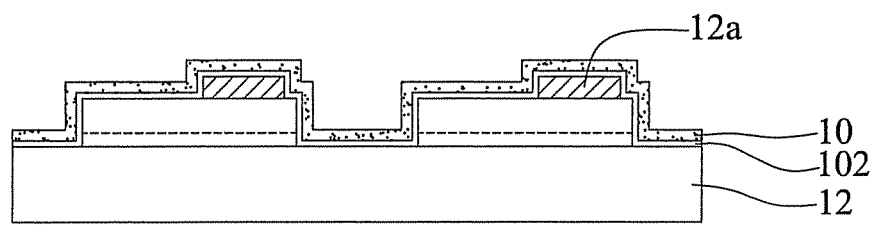
FIGS. 2A and 2B are schematic diagrams of a method for transferring a uniform phosphor layer on an article of a second embodiment according to the present invention.
Figure 2B:
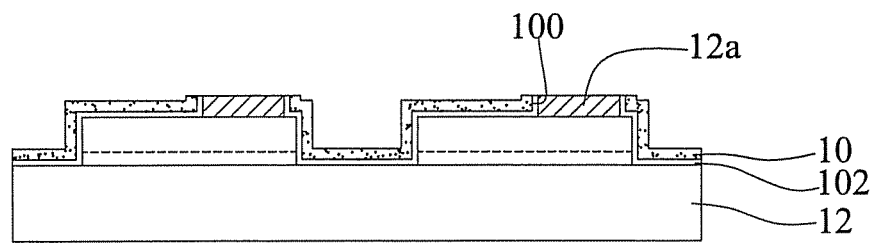

FIGS. 2A and 2B are schematic diagrams of a method for transferring a uniform phosphor layer on an article of a second embodiment according to the present invention. The second embodiment differs from the first embodiment in that the uniform phosphor layer 10 is further patterned following the uniform phosphor layer 10 being attached and secured to the surface of the article 12.

The method of the present invention may be applied to a variety of articles, such as LED wafer, LED die, LED package or lens. When the article is an LED wafer or LED die, at least one metal pad is further installed on the surface of the article, for wire bonding purpose. Therefore, after the uniform phosphor layer 10 is attached and secured to the surface of the article 12, the metal pad 12a has to be exposed from the uniform phosphor layer 10, as shown in FIG. 2B. The present invention may adopt a lithography process such as an etching process to pattern the uniform phosphor layer 10, in order to expose the metal pad 12a therefrom. Alternatively, a laser ablation technique may be used to remove a portion of the uniform phosphor layer 10, in order to expose the metal pad 12a therefrom. If the binder layer 102 is included, the binder layer 102 is also patterned.

The Third Embodiment

FIGS. 3A to 3D are schematic diagrams of a method for transferring a uniform phosphor layer on an article of a third embodiment according to the present invention. The third embodiment differs from the second embodiment in that the surface of the article 12 in a proximity of the uniform phosphor layer 10 has a pedestal 12b formed on the metal pad 12a, and the pedestal 12b is removed on demands.

Figure 3A:
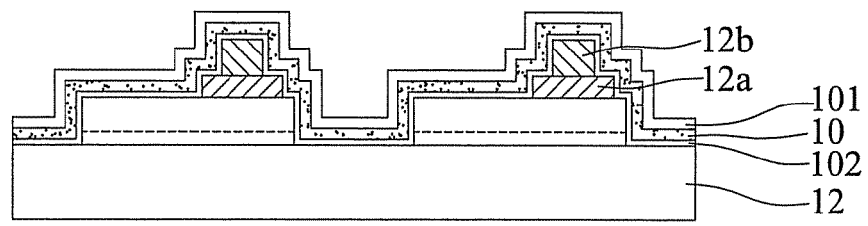
FIGS. 3A to 3D are schematic diagrams of a method for transferring a uniform phosphor layer on an article of a third embodiment according to the present invention.
Figure 3B:
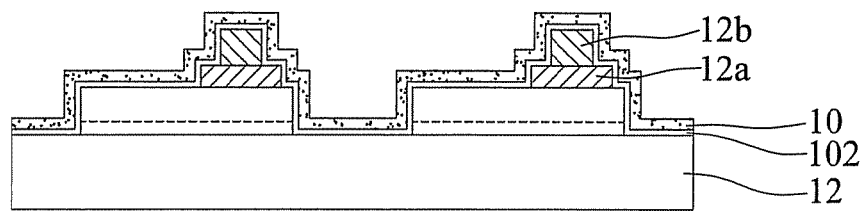

As shown in FIGS. 3A and 3B, after the uniform phosphor layer 10 is attached and secured, the release film 101 is removed.

Figure 3C:
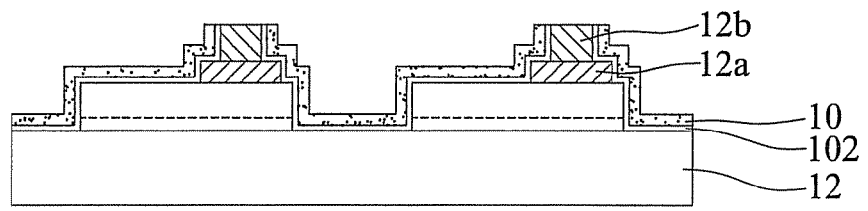

When the pedestal 12b is an electrically conductive pedestal, the uniform phosphor layer 10 may be patterned by chemical or mechanical polishing processes, so as to expose the pedestal 12b, as shown in FIG. 3C.

Figure 3D:
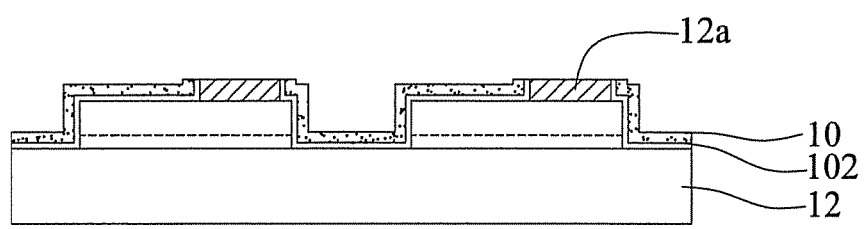

If the pedestal 12b is made of an insulation material, the pedestal 12b may be removed, so as to expose the metal pad 12a, as shown in FIG. 3D.

According to the above method, the present invention further provides a light-emitting structure having a uniform phosphor layer, comprising: an light-emitting article 12, such as an LED wafer or LED die, the light-emitting article 12 having at least one metal pad formed on a surface thereof; and a uniform phosphor layer 10 that is secured on the surface of the light-emitting article 12, wherein the uniform phosphor layer 10 has an opening 100 corresponding to the metal pad 12a that exposes the metal pad 12a.

The light-emitting article 12 may further comprise a pedestal 12b formed on the metal pad 12a, and the pedestal 12b is exposed from the uniform phosphor layer 10.

The light-emitting structure further comprises a binder layer 102 sandwiched between the article 12 and the uniform phosphor layer 10 that secures the uniform phosphor layer 10 on the surface of the article 12.

The Fourth Embodiment

Figure 4A:
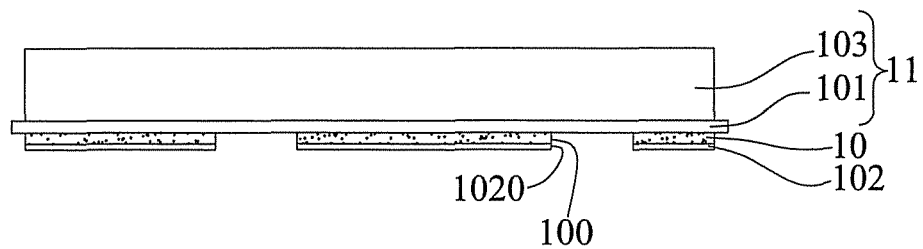
FIGS. 4A to 4C are schematic diagrams of a method for transferring a uniform phosphor layer on an article of a fourth embodiment according to the present invention.
Figure 4B:
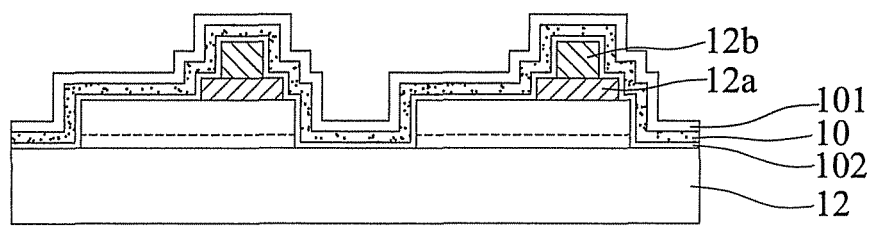
Figure 4C:
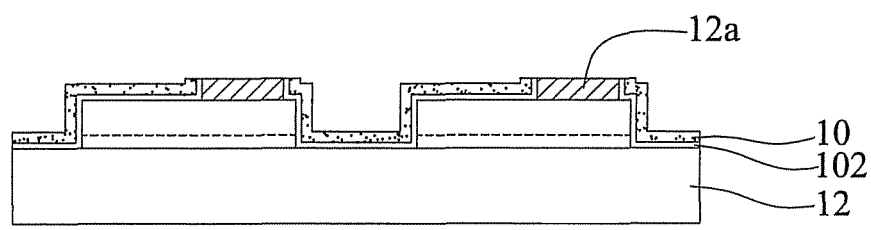

FIGS. 4A to 4C are schematic diagrams of a method for transferring a uniform phosphor layer on an article of a fourth embodiment according to the present invention. The fourth embodiment differs from the previous embodiments in that the uniform phosphor layer 10 on the carrier 11 has an opening 100 (if having the binder layer 102, the binder layer 102 has a corresponding opening 1020) corresponding to the metal pad 12a, and the metal pad 12a is exposed through the opening 100 following the uniform phosphor layer 10 being attached and secured to the surface of the article 12.

As shown in FIG. 4B, the surface of the article 12 in a proximity of the uniform phosphor layer 10 has a pedestal 12b positioned on the metal pad 12a. Also, as shown in FIG. 4C, the pedestal 12b may be removed on demands, after the uniform phosphor layer 10 is attached and secured.

Figure 5A:
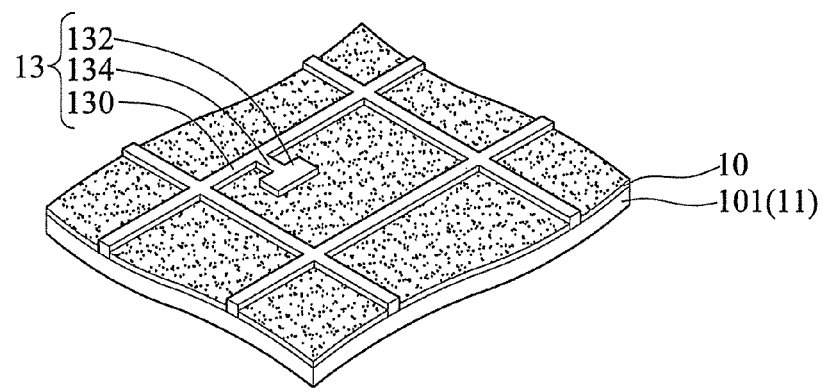
FIGS. 5A to 5C are schematic diagrams of a method for forming a uniform phosphor layer having an opening of an embodiment according to the present invention.
Figure 5A:
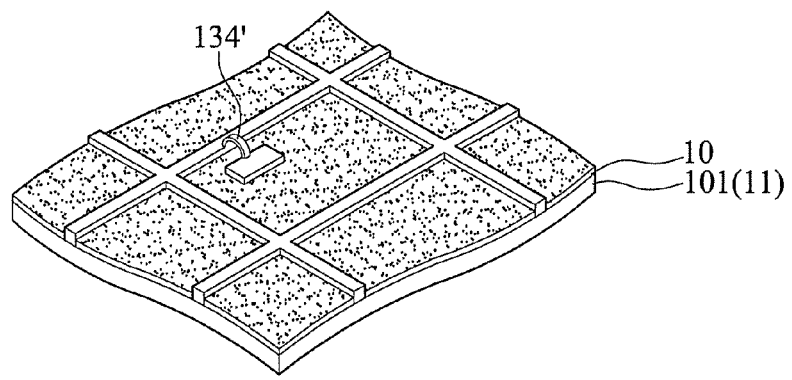
Figure 5B:
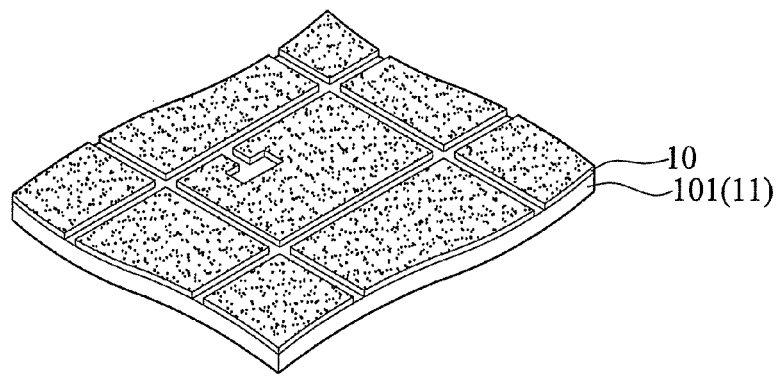
Figure 5C:
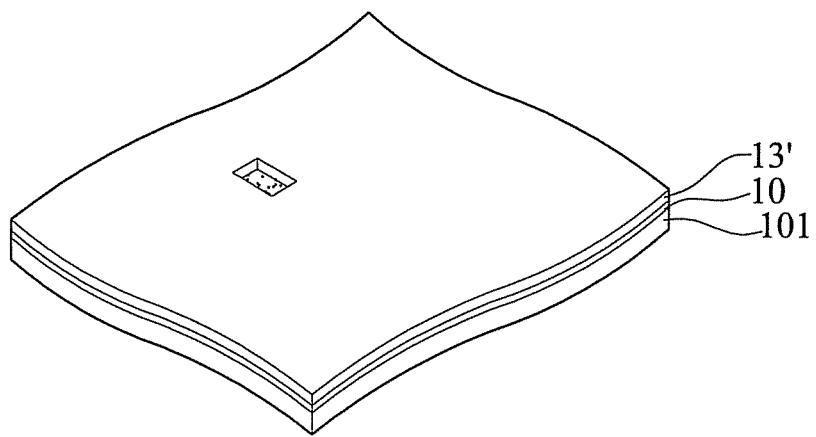

FIGS. 5A to 5C are schematic diagrams of a method for forming a uniform phosphor layer having an opening of an embodiment according to the present invention.

As shown in FIG. 5A, the uniform phosphor layer having the opening is formed by: depositing on the carrier 11 (or the release film 101) a first mask 13 having a backbone 130, a cover part 132 covered on a predetermined site of the opening 100, and a connection part 134 which connects the backbone 130 and the cover part 132, wherein the connection part 134 is covered on the surface of the carrier 11; forming the uniform phosphor layer 10 on the surface of the carrier 11 by electrostatic charges (though the first mask 13 may also attach the phosphor particles, they are omitted in the drawing).

As shown in FIGS. 5B and 5C, the first mask 13 is removed; a second mask 13' is covered on the carrier 11, to expose the surface of the carrier 11 that matches the covered position of the connection part 134; and repeating the step of applying electrostatic charges, to form the uniform phosphor layer 10 on a position of the surface of the carrier 11 corresponding to the connection part 134.

Alternatively, as shown in FIG. 5A', the connection part 134' is positioned on the surface of the carrier 11.

The Fifth Embodiment

Figure 6A:
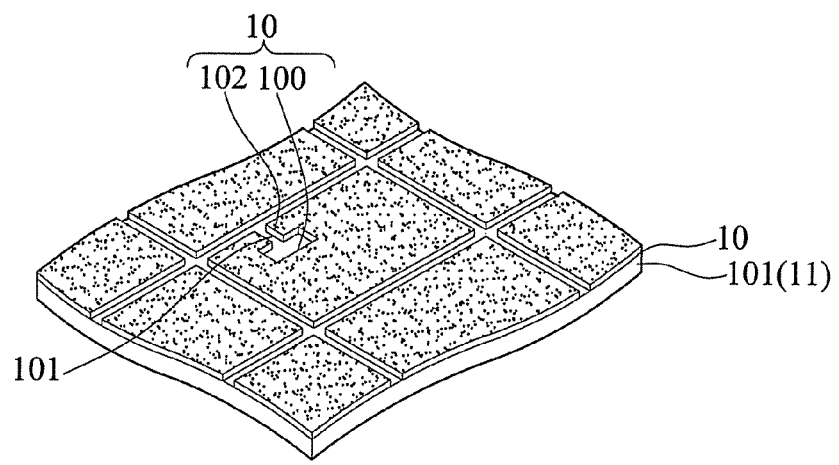
Figure 6B:
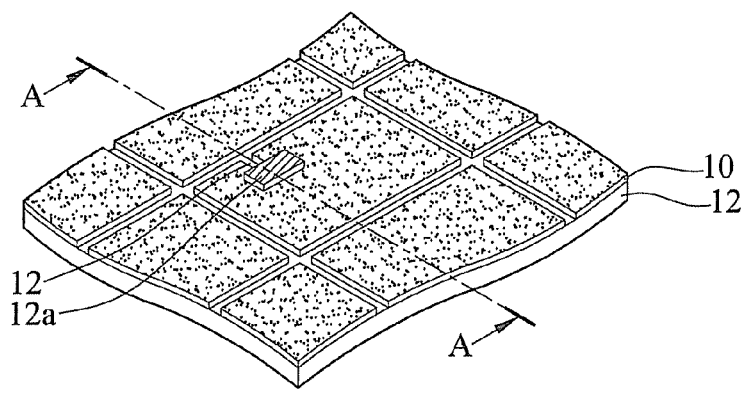
Figure 6C:
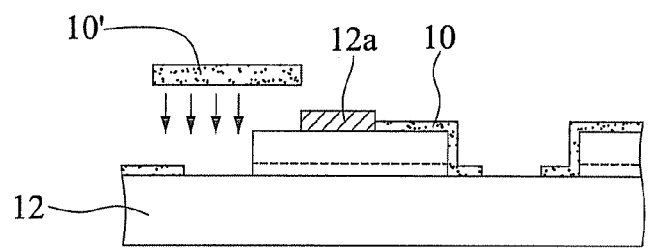

Please refer to FIGS. 6A to 6C, which are schematic diagrams of a method for transferring a uniform phosphor layer on an article of a fifth embodiment according to the present invention. The fifth embodiment differs from the fourth embodiment in that, in the fifth embodiment, the electrostatic charge process is not performed iteratively on the carrier 11. In the fifth embodiment, after the first uniform phosphor layer 10 is attached, another uniform phosphor layer 10' having a small area that is fabricated by the electrostatic attachment process is attached to the carrier 11.

As shown in FIG. 6A, the uniform phosphor layer 10 on the carrier 11 has an opening 100 corresponding to the metal pad, and a gap 102 extended from the opening 100.

As shown in FIG. 6B, after the uniform phosphor layer 10 is attached and secured on the article 12, the metal pad 12a and a part of the surface of the article 12 are exposed.

As shown in FIG. 6C', another uniform phosphor layer 10' corresponding to the gap 102 in size is attached and secured on the exposed part of the surface of the article 12.

The Sixth Embodiment

Figure 7A:
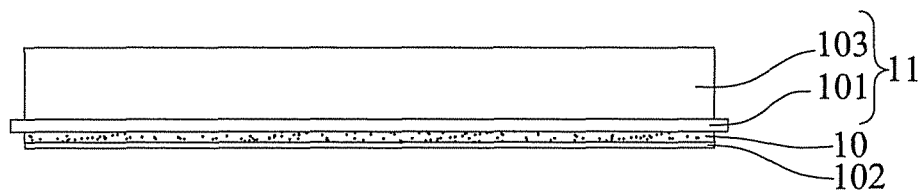
FIGS. 7A to 7C illustrate a method for transferring a uniform phosphor layer to an LED package of an embodiment according to the present invention.
Figure 7B:
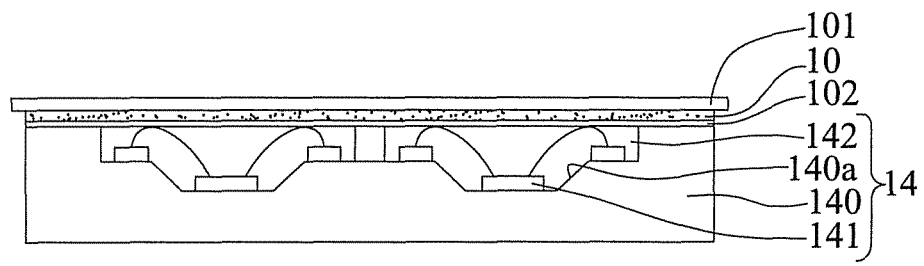
Figure 7C:
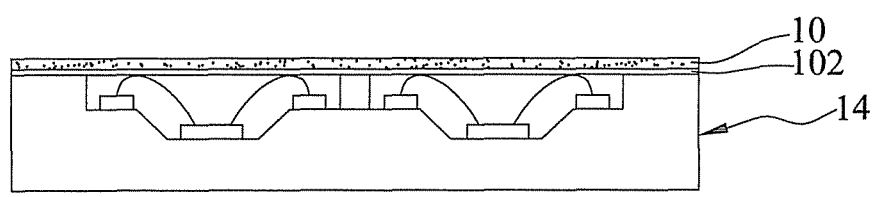

Please refer to FIGS. 7A to 7C, which illustrate a method for transferring a uniform phosphor layer to an LED package of a sixth embodiment according to the present invention. The sixth embodiment differs from the first embodiment in that, in the sixth embodiment, the article is replaced with an LED package.

As shown in FIG. 7A, a carrier 11 is provided having a uniform phosphor layer 10 formed on a surface thereof. The carrier 11 comprises a body 103 and a release film 101 mechanically or vacuumedly attached to the body 103. The uniform phosphor layer 10 is positioned on the release film 101. A binder layer 102 may be further formed on the uniform phosphor layer 10 of the carrier 11 following the electrostatic charge process.

The LED package 14 comprises a substrate 140 having a recess 140a, an LED die 141 disposed in the bottom of the recess 140a, and an encapsulant 142 formed in the recess 140a and covered the LED die 141.

As shown in FIGS. 7B and 7C, the uniform phosphor layer 10 is attached and secured on the surface of the encapsulant 142, and then the release film 101 is removed.

The Seventh Embodiment

Please refer to FIGS. 8A to 8D, which illustrate a method for transferring a uniform phosphor layer to an lens of an embodiment according to the present invention. The seventh embodiment differs from the first embodiment in that, in the seventh embodiment, the article is replaced with an lens.

Figure 8A:
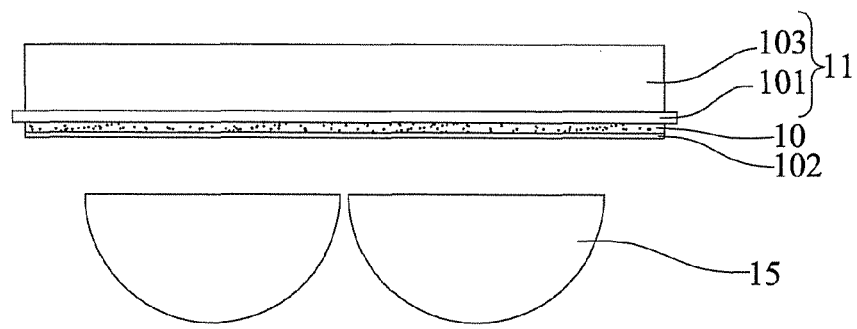
FIGS. 8A to 8D illustrate a method for transferring a uniform phosphor layer to an lens of an embodiment according to the present invention.

As shown in FIG. 8A, a carrier 11 is provided having a uniform phosphor layer 10 formed on a surface thereof. The carrier 11 comprises a body 103 and a release film 101 mechanically or vacuumedly attached to the body 103. The uniform phosphor layer 10 is positioned on the release film 101. A binder layer 102 may be further formed on the uniform phosphor layer 10 of the carrier 11 following the electrostatic charge process.

Figure 8B:
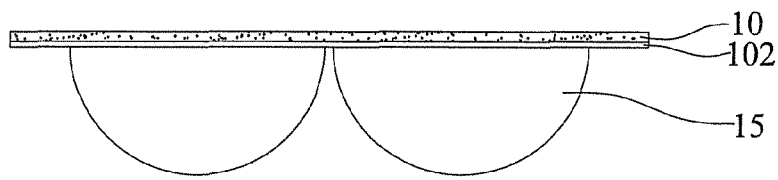

As shown in FIG. 8B, the article is a lens 15, the uniform phosphor layer 10 is attached and secured on a surface of the lens 15, and the release film 101 is then removed.

Figure 8C:
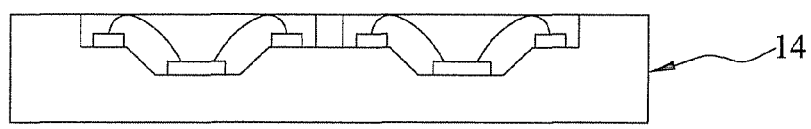
Figure 8D:
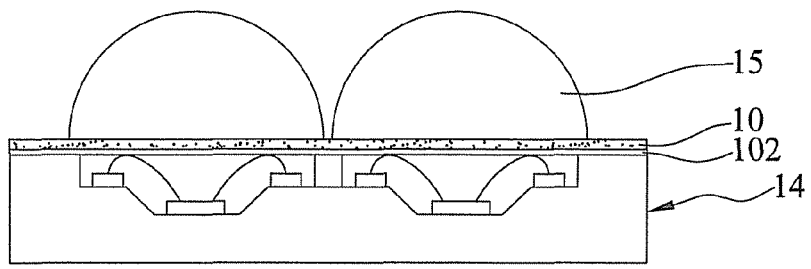

As shown in FIGS. 8C and 8D, after the uniform phosphor layer 10 is secured to the surface of the lens 15, the uniform phosphor layer 10 on the lens 15 is further bond onto the LED package 14. The light-emitting structure fabricated in the seventh embodiment, since having the lens, has improved light extraction, as compared with the sixth embodiment. Further, the uniform phosphor layer 10 formed on the surface of the lens 15 may be further connected to a substrate or a heat dissipating component, to improve the heat dissipation efficiency (not shown).

According to the previous method, the present invention further provides a light-emitting structure having a uniform phosphor layer. The light-emitting structure comprises an LED package 14 comprising a substrate 140 having a recess 140a, an LED die 141 disposed in the bottom of the recess 140a, and an encapsulant 142 formed in the recess 140a and covered the LED die 141; and a uniform phosphor layer 10 that is secured to the surface of the encapsulant 142. The light-emitting structure may further comprise a lens 15 installed on the uniform phosphor layer 10, such that the uniform phosphor layer 10 is sandwiched between the encapsulant 142 and the lens 15. The light-emitting structure may further comprise a binder layer 102 that is sandwiched between the encapsulant 142 and the uniform phosphor layer 10, to secure the uniform phosphor layer 10 to the surface of the encapsulant 142.

According to the previous method, in an embodiment, the uniform phosphor layer comprises phosphor powders that are constituted by a plurality of phosphor particles, and none of the phosphor particles is completely separated from adjacent ones. Alternatively, the uniform phosphor layer comprises phosphor powders and a binder material, and the phosphor powders in the uniform phosphor layer occupy more than 75% in volume of the uniform phosphor layer.

Figure 9A:
FIGS. 9A to 9D show the distribution of a uniform phosphor layer that is formed by a slurry method and a package structure of a uniform phosphor layer according to the present invention.
Figure 9B:
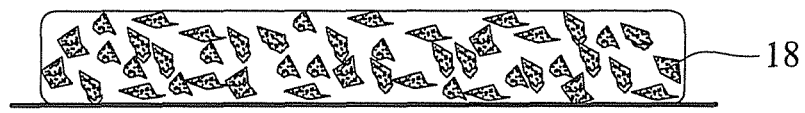

Please refer to FIGS. 9A to 9D, which show the distribution of a uniform phosphor layer that is formed by a slurry method and a package structure of a uniform phosphor layer according to the present invention. In a package structure in which phosphor powders or phosphor particles constituted by phosphor powders and a binder material are deposited according to the present invention, as shown in FIG. 9A, the phosphor powders 18 are highly packed on the surface. The phosphor powders occupy more than 75% in volume of the uniform phosphor layer, which is unlikely to be realized by a slurry method of phosphor silicon mixture shown in FIG. 9B. Such a highly packed phosphor powders 18 may facilitate the dissipation of the heat converted from light in the phosphor powders 18, since the heat is conducted and dissipated through the connected particles. In the slurry method, heat is conducted through silicon filled among the particles that has poor heat conduction efficiency. Improved heat dissipation efficiency brings increased conversion efficiency and improved light attenuation due to heat.

Figure 9C:
Figure 9D:

According to an embodiment of the present invention, a variety of phosphor powders 18 and 19 may be deposited in a layer structure shown in FIG. 9C, with regard to the applications that have a variety of phosphor powders having different light properties. In the layer structure, the phosphor powders 18 and 19 are deposited on different layers. In the slurry method, different phosphor powders are distributed on a silicon layer such as a phosphor silicon mixture shown in FIG. 9D.

According to an embodiment of this type of layer structure shown in FIG. 9C, the light color property may be optimized by reordering the various properties of the phosphor particles, so as to minimize the light re-absorption among the various light properties of phosphor particles, and increase light conversion efficiency.

Figure 10A:
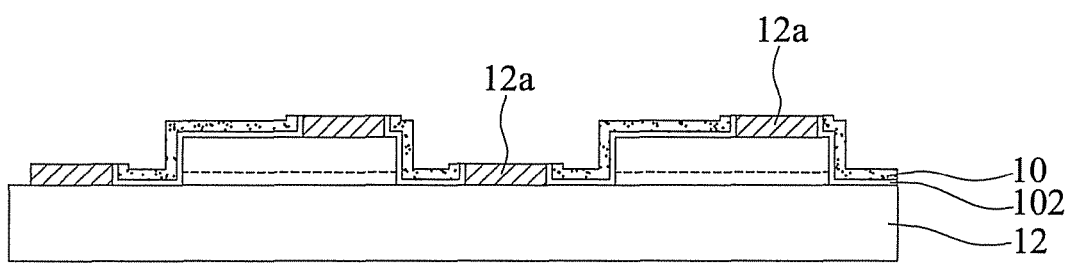
FIGS. 10A and 10B are cross-sectional views illustrating transferring a uniform phosphor layer to various types of LED wafers or LED dies according to the present invention.
Figure 10B:
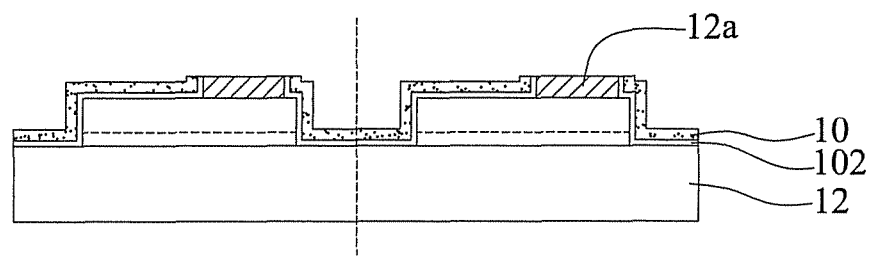

Please refer to FIGS. 10A and 10B, which are cross-sectional views illustrating transferring a uniform phosphor layer to an LED wafer or LED die according to the present invention. P contacts and n contacts (and a metal pad 12a) of the LED wafer or LED die may be disposed at the same side or opposing sides. In the method according to the present invention, since the uniform phosphor layer formed on the carrier may have an opening corresponding to a metal pad of the LED wafer or LED die, or the uniform phosphor layer is patterned to expose the metal pad after the uniform phosphor layer is attached and secured, the method of the present invention may be applied to various types of LED wafers or LED dies.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method for transferring a uniform phosphor layer on an article, comprising the steps of:
    providing the article and a carrier, wherein the uniform phosphor layer is formed on a surface of the carrier through an electrostatic charge process, wherein the uniform phosphor layer comprises phosphor powders and a binder material, and the phosphor powders in the uniform phosphor layer occupy more than 75% in volume of the uniform phosphor layer;
    disposing another surface of the article in a proximity of the uniform phosphor layer;
    causing the uniform phosphor layer from the surface of the carrier to be attached and secured to the another surface of the article; and
    removing the carrier.

2. The method of claim 1, wherein the uniform phosphor layer is attached and secured to the another surface of the article by applying a vacuum to a space between the article and the carrier.

3. The method of claim 1, wherein the carrier comprises a body and a release film disposed thereon, and the uniform phosphor layer is positioned on the release film.

4. The method of claim 3, wherein the release film and the uniform phosphor layer are secured to the another surface of the article together, and the method further comprises removing the release film.

5. The method of claim 1, wherein the phosphor powders are constituted by a plurality of phosphor particles, none of which is completely separated from adjacent ones.

6. The method of claim 1, wherein the carrier further comprises a binder layer formed on the uniform phosphor layer, and the uniform phosphor layer is secured on the another surface of the article through the binder layer.

7. The method of claim 1, wherein the article is an LED wafer, an LED die, an LED package or a lens.

8. The method of claim 7, wherein the article is an LED package comprising:
    a substrate having a recess;
    an LED die disposed in the bottom of the recess; and
    an encapsulant formed in the recess and covered the LED die,
    wherein the uniform phosphor layer is attached and secured to the surface of the encapsulant.

9. The method of claim 7, wherein the article is a lens, and the method further comprises bonding the uniform phosphor layer on the lens onto an LED package.

10. The method of claim 1, wherein the article further has at least one metal pad formed on the another surface thereof, and the method further comprises patterning the uniform phosphor layer to expose the metal pad therefrom following the uniform phosphor layer being secured to the another surface of the article.

11. The method of claim 10, wherein the article further has a pedestal formed on the at least metal pad, and the pedestal is removed in the step of patterning the uniform phosphor layer.

12. The method of claim 1, wherein the article further has at least one metal pad and a pedestal formed thereon on the another surface thereof, and the method further comprises patterning the uniform phosphor layer to expose the pedestal following the uniform phosphor layer being secured to the another surface of the article.

13. The method of claim 1, wherein the article further has at least one metal pad formed on the surface thereof, the uniform phosphor layer formed on the carrier has at least one opening corresponding to the metal pad, and the metal pad is exposed through the opening following the uniform phosphor layer being secured to the surface of the article.

14. The method of claim 13, wherein the article further has a pedestal formed on the at least metal pad, and the method further comprises removing the pedestal following the uniform phosphor layer being secured to the surface of the article.

15. The method of claim 13, wherein the uniform phosphor layer having the opening is formed by:
    deposing on the carrier a first mask having a backbone, a cover part covered on a predetermined site of the opening, and a connection part which connects the backbone and cover part;
    forming the uniform phosphor layer on the surface of the carrier by electrostatic charges; and
    removing the first mask.

16. The method of claim 15, wherein the connection part is covered on the surface of the carrier, and the uniform phosphor layer is further formed by deposing a second mask on the carrier to expose the surface of the carrier that matches the covered position of the connection part following removing the first mask, and repeating the step of applying electrostatic charges.

17. The method of claim 15, wherein the connection part is positioned above the surface of the carrier.

18. The method of claim 1, wherein the article further has at least one metal pad formed on the surface thereof in proximity of the uniform phosphor layer, the uniform phosphor layer formed on the carrier has at least one opening corresponding to the metal pad and a gap extended from the opening such that a part of the surface of the article is exposed from the gap after attaching the uniform phosphor layer, and the method further comprises making an another uniform phosphor layer to be attached and secured to the exposed surface of the article.

19. The method of claim 1, wherein the carrier and the article are compressed, such that the uniform phosphor layer is secured on the another surface of the article.

* * * * *